(12) United States Patent
Hwang

(10) Patent No.: US 11,806,767 B2
(45) Date of Patent: Nov. 7, 2023

(54) SUBSTRATE PROCESSING APPARATUS AND SUBSTRATE PROCESSING METHOD

(71) Applicant: SEMES CO., LTD., Cheonan-si (KR)

(72) Inventor: Ho Jong Hwang, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/825,049

(22) Filed: May 26, 2022

(65) Prior Publication Data

US 2023/0166307 A1 Jun. 1, 2023

(30) Foreign Application Priority Data

Nov. 30, 2021 (KR) .......................... 10-2021-0168349

(51) Int. Cl.
*B08B 9/093* (2006.01)
(52) U.S. Cl.
CPC .................................. *B08B 9/093* (2013.01)

(58) Field of Classification Search
CPC ...................................................... B08B 9/093
See application file for complete search history.

(56) References Cited

FOREIGN PATENT DOCUMENTS

KR 10-1042538 B1 6/2011

*Primary Examiner* — Jason Y Ko

(57) ABSTRACT

A substrate processing apparatus includes a spraying unit installed in an inner space of a chamber member in which a substrate is processed, spraying a cleaning liquid into the inner space of the chamber member so as to clean devices for discharging a chemical liquid to the substrate and then collecting the chemical liquid, and spraying a drying gas for drying the remaining cleaning liquid into the inner space of the chamber member, a management unit removing a residue remaining on the spraying unit after the spraying unit sprays the cleaning liquid, and a controller controlling the spraying unit and the management unit.

14 Claims, 8 Drawing Sheets

SUBSTRATE PROCESSING APPARATUS AND SUBSTRATE PROCESSING METHOD

CROSS REFERENCE TO RELATED APPLICATION

The present application claims priority to Korean Patent Application No. 10-2021-0168349, filed on Nov. 31, 2021, the entire contents of which are incorporated by reference herein for all purposes.

BACKGROUND OF THE INVENTION

Field of the Invention

The present disclosure relates generally to a substrate processing apparatus and a substrate processing method including the same. More particularly, the present disclosure relates to a substrate processing apparatus that can be used to process a substrate and to a substrate processing method including the same apparatus.

Description of the Related Art

Conventional cleaning methods used for a semiconductor wafer cleaning process can be largely classified into dry cleaning and wet cleaning. Of which, the wet cleaning is a cleaning method which uses various chemical fluids and is classified into a batch type in which a plurality of wafers are processed simultaneously and a single wafer type in which each single wafer is processed individually.

For conventional wet cleaning methods for substrates such as semiconductor wafers in relation to a batch-type cleaning apparatus, a so-called batch-type wet cleaning system has become mainstream, in which a plurality of wafers stored in a carrier cassette are immersed sequentially in a plurality of wet bench-type cleaning baths arranged in series, or a plurality of wafers are directly immersed in the cleaning baths through a transfer device without being stored in a carrier cassette.

As described above, the batch-type cleaning apparatus removes contaminants by immersing a plurality of substrates simultaneously in a cleaning bath containing a cleaning fluid. However, a drawback of the conventional batch-type cleaning apparatus is that it is difficult to cope with the trend of increasing the size of the substrates, and the use amount of the cleaning fluid is increased. If the substrate is damaged during the cleaning process in the batch-type cleaning apparatus, other substrates in the cleaning bath are naturally also affected. Therefore, there is a possibility in that a large number of substrates may be defective.

As semiconductor devices have entered the submicron era, they have become miniaturized and highly integrated. Along with this trend, the surface of wafers is required to have a very high degree of cleanliness. As a wet cleaning technology that satisfies the demand for a higher cleanliness unlike the batch-type wet cleaning system described above, a single wafer-type wet cleaning system has been proposed, in which wafers that are not stored in a cassette are wet-cleaned individually in a sealed cleaning housing.

Under the single wafer-type wet cleaning system, each single substrate is processed individually using a single wafer-type cleaning apparatus. The single wafer-type cleaning apparatus removes contaminants by spinning a substrate at a high speed and spraying a cleaning liquid onto the surface of the substrate. The contaminants are removed by means of centrifugal force caused by the spinning of the substrate and pressure caused by the spraying of the cleaning liquid.

The single-wafer cleaning apparatus typically includes a chamber in which a substrate is received and a cleaning process is performed, a spin chuck rotating in a state of fixing the substrate, and a nozzle assembly for supplying a cleaning liquid including a chemical liquid, a rinse liquid, and a drying gas to the substrate. The cleaning liquid that is sprayed onto the substrate from the nozzle assembly during the cleaning process and then scattered from the surface of the substrate is collected and recovered at a side of the chamber.

To clean the inside of the above-described conventional cleaning apparatus, cleaning is performed by spraying of a cleaning liquid, and only the spin chuck and a bowl can be partially cleaned. The cleaning liquid is sprayed by the nozzle for processing the substrate, so residual contaminants resulting from a previous process may contaminate the nozzle and affect a subsequent process. Therefore, a user may have to periodically perform a cleaning operation by opening the chamber. This may result in the user being exposed to harmful chemicals, and may decrease productivity.

The foregoing is intended merely to aid in the understanding of the background of the present disclosure, and is not intended to mean that the present disclosure falls within the purview of the related art that is already known to those skilled in the art.

Documents of Related Art (Patent document 1) Korean Patent No. 10-1042538

SUMMARY OF THE INVENTION

Accordingly, the present disclosure has been made keeping in mind the above problems occurring in the related art, and an objective of the present disclosure is to provide a substrate processing apparatus capable of cleaning an inside of a chamber.

According to an aspect of the present invention, a substrate processing apparatus includes: a spraying unit installed in an inner space of a chamber member in which a substrate is processed, configured to spray a cleaning liquid into the inner space of the chamber member so as to clean devices for discharging a chemical liquid to the substrate and then collecting the chemical liquid, and configured to spray a drying gas for drying the remaining cleaning liquid into the inner space of the chamber member; a management unit configured to remove a residue remaining on the spraying unit; and a controller configured to control the spraying unit and the management unit.

According to an aspect of the present invention, a substrate processing apparatus includes: a chamber member including an inner space; a rotation unit installed in the inner space of the chamber member, configured to support the substrate, and configured to rotate the substrate; a chemical liquid discharging unit positioned above the rotation unit and configured to discharge a chemical liquid to the rotation unit; a chemical liquid recovery unit positioned adjacent to the rotation unit and configured to collect the chemical liquid scattered from the rotation unit; a spraying unit installed to be movable in an upper portion of the inner space of the chamber member configured to spray a cleaning liquid to the rotation unit, the chemical liquid discharging unit, and the chemical liquid recovery unit, and configured to spray a drying gas for drying the remaining cleaning liquid into the inner space of the chamber member; a management unit configured to remove a residue remaining on the spraying unit after the spraying unit sprays the cleaning liquid; and a controller configured to control the spraying unit and the management unit.

According to an aspect of the present invention, a substrate processing method includes: moving a nozzle member from a management unit; spraying a cleaning liquid into an inner space of a chamber member; spraying a drying gas into the inner space of the chamber member; returning the nozzle member to the management unit; and removing, by the management unit, a residue remaining on the nozzle member.

According to an aspect of the present invention, the substrate processing apparatus according to the embodiment of the present disclosure automatically cleans the inside of the chamber member using the spraying unit, thereby eliminating the need for a user to perform a separate cleaning operation by opening the chamber member. This can reduce a maintenance cycle, resulting in improved productivity.

According to an aspect of the present invention, the substrate processing apparatus according to the embodiment of the present disclosure cleans the spraying unit using the management unit, thereby preventing contamination of the spraying unit.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
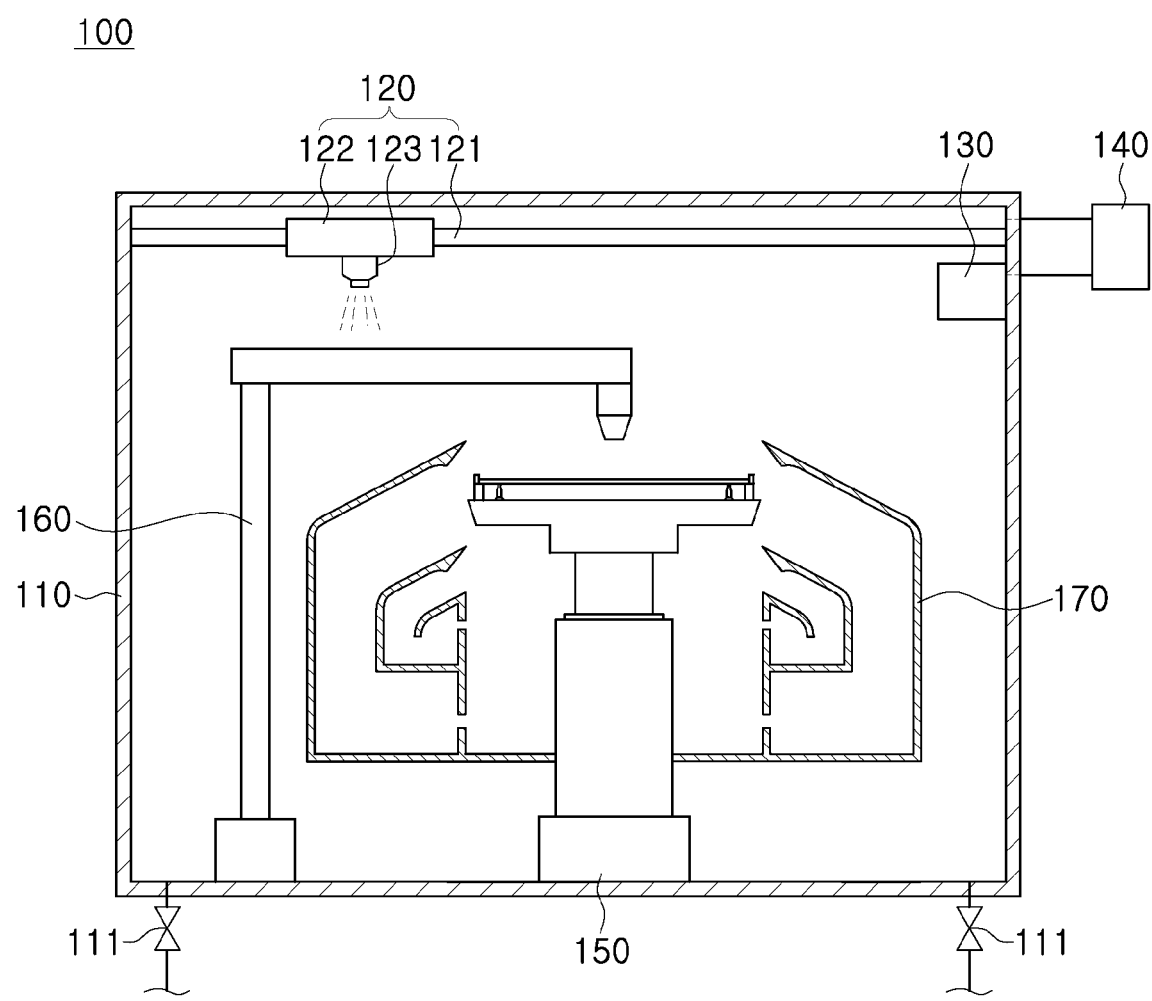
FIG. 1 is a view illustrating a substrate processing apparatus according to an embodiment of the present disclosure.
Figure 2:
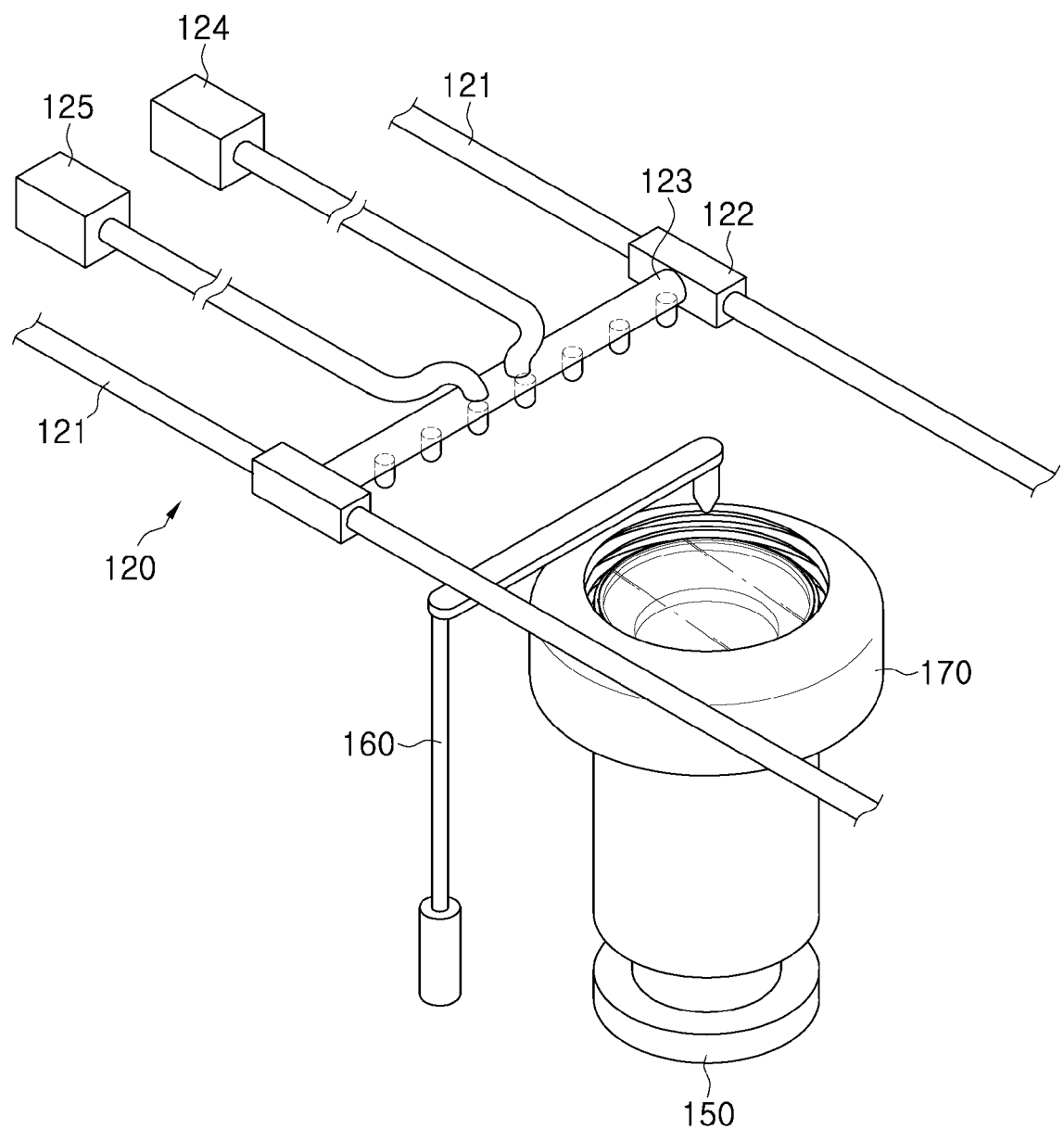
FIG. 2 is a perspective view illustrating an inside of a chamber member in the substrate processing apparatus illustrated in FIG. 1.
Figure 3:
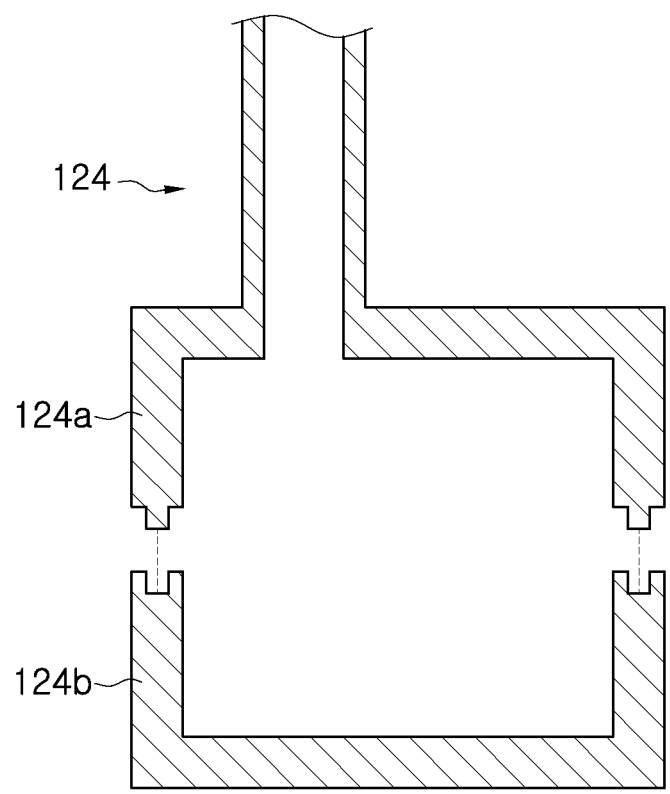
FIG. 3 is a sectional view illustrating a cleaning liquid storage member.
Figure 4:
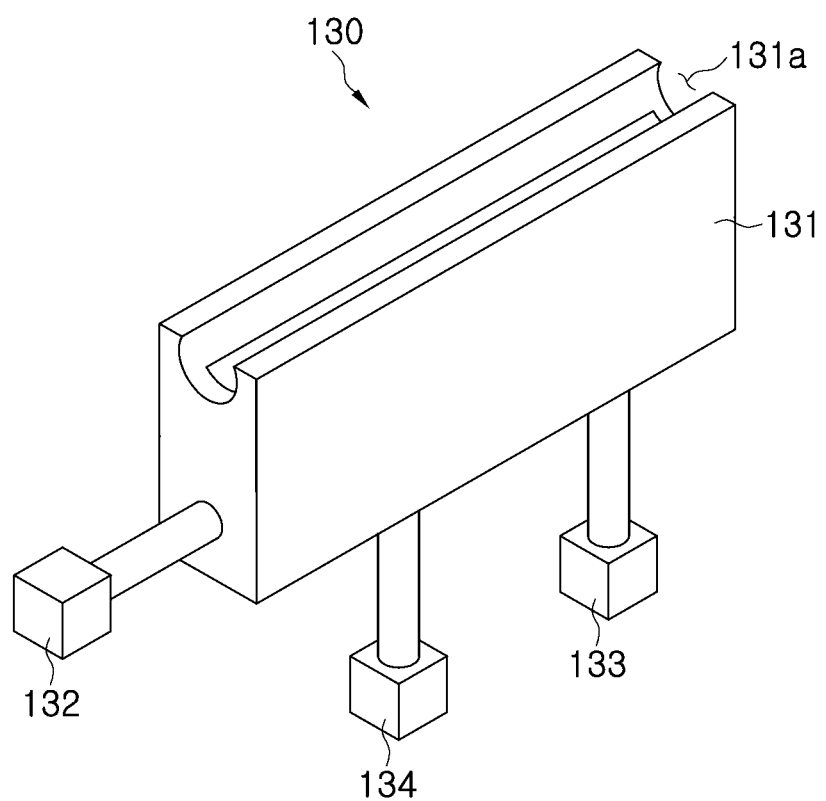
FIG. 4 is a perspective view illustrating a management unit.

Hereinafter, exemplary embodiments of the present disclosure will be described in detail with reference to the accompanying drawings such that the present disclosure can be easily embodied by one of ordinary skill in the art to which this disclosure belongs. The present disclosure may, however, be embodied in many different forms and should not be construed as being limited to only the embodiments set forth herein.

For clarity, a description of parts not related to describing the present disclosure is omitted here, and the same reference numerals are allocated to the same or similar components throughout the disclosure.

Components having the same structure in various embodiments will be allocated the same reference numeral and explained only in a representative embodiment, and components which are different from those of the representative embodiment will be described in the other embodiments.

It will be understood that when an element is referred to as being "connected to" or "coupled to" another element, the element can be directly connected to or coupled to the other element or be indirectly connected to or coupled to the other element having an intervening element therebetween. Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a substrate processing apparatus according to an embodiment of the present disclosure will be described in detail with reference to the drawings.

Referring to FIG. 1, the substrate processing apparatus 100 according to the embodiment may include a spraying unit 120, a management unit 130, and a controller 140.

The spraying unit 120 is installed in an inner space of a chamber member 110 in which a substrate is processed. The spraying unit 120 may spray a cleaning liquid into the inner space of the chamber member 110 so as to clean devices for discharging a chemical liquid to the substrate and then recovering the chemical liquid, and may spray a drying gas for drying the remaining cleaning liquid into the inner space of the chamber member 110. For this purpose, the spraying unit 120 may be installed to be movable in an upper portion of the inner space of the chamber member 110.

The management unit 130 may remove a residue remaining on the spraying unit 120. The management unit 130 for this purpose may be installed on an upper end of an inner wall of the chamber member 110. After the spraying unit 120 sprays the cleaning liquid, the cleaning liquid may remain on an outer surface of the spraying unit 120.

The management unit 130 may remove the cleaning liquid remaining on the spraying unit 120 so that the spraying unit 120 is always kept clean in a non-operational state. This can prevent the cleaning liquid remaining on the spraying unit 120 from contaminating the substrate while the substrate is treated with the chemical liquid. A detailed description of the management unit 130 for this purpose will be described later.

The controller 140 may control the spraying unit 120 and the management unit 130. The controller 140 may operate the spraying unit 120 every reference number of times the substrate is processed. For example, immediately after five substrates are processed by the substrate processing apparatus 100, the controller 140 may operate the spraying unit 120 to clean the inner space of the chamber member 110. In other words, the substrate processing apparatus 100 according to the embodiment of the present disclosure performs cleaning before the inner space of the chamber member 110 is heavily contaminated by the chemical liquid, thereby significantly reducing the number of times the chamber member 110 is cleaned separately.

The substrate processing apparatus 100 according to the embodiment of the present disclosure automatically cleans the inside of the chamber member 110 using the spraying unit 120, thereby eliminating the need for a user to perform a separate cleaning operation by opening the chamber member 110. This can reduce a maintenance cycle, resulting in improved productivity.

The substrate processing apparatus 100 according to the embodiment of the present disclosure cleans the spraying unit 120 using the management unit 130, thereby preventing contamination of the spraying unit 120.

The substrate processing apparatus 100 configured as such will be described in more detail. The substrate processing apparatus 100 includes the chamber member 110, a rotation unit 150, a chemical liquid discharging unit 160, and a chemical liquid recovery unit 170.

The chamber member 110 includes the inner space. At least one discharge valve 111 may be installed on a bottom surface of the chamber member 110. The discharge valve 111 may discharge a cleaning liquid. The cleaning liquid may be sprayed from the spraying unit 120 which will be described later, and then collected on the bottom surface of the chamber member 110.

The rotation unit 150 is installed in the inner space of the chamber member 110, supports the substrate, and rotates the substrate. The rotation unit 150 may have an upper surface that is circular when viewed from above. The substrate may be seated on the upper surface of the rotation unit 150. When the upper surface of the rotation unit 150 is rotated, the substrate may be rotated thereby. When the chemical liquid is discharged to the center of the substrate by the chemical liquid discharging unit 160 which will be described later, the chemical liquid may be spread to the outer periphery of the substrate by centrifugal force.

The chemical liquid discharging unit 160 is positioned above the rotation unit 150 and discharges the chemical liquid to the rotation unit 150. The chemical liquid discharging unit 160 may pump the chemical liquid stored in a storage tank (not illustrated) and discharge the chemical liquid to the substrate.

The chemical liquid may be used for various purposes, and examples of the chemical liquid may include at least one selected from the group consisting of hydrofluoric acid (HF), sulfuric acid ($H_3SO_4$) nitric acid ($HNO_3$), phosphoric acid ($H_3PO_4$), and an SC-1 solution (a mixture of ammonium hydroxide ($NH_4OH$), hydrogen peroxide ($H_2O_2$), and water ($H_2O$)). Here, in a case where the substrate processing apparatus 100 performs an etching process of etching the substrate, the chemical liquid discharged from the chemical liquid discharging unit 160 may be an aqueous solution of phosphoric acid.

In an embodiment, deionized water (DIW) may be used as a chemical liquid used for cleaning, and nitrogen ($N_2$), isopropyl alcohol (IPA), etc. may be used as a gas used for drying.

The chemical liquid recovery unit 170 is positioned adjacent to the rotation unit 150 and recovers (i.e., collect) the chemical liquid scattered from the rotation unit 150. In an embodiment, the collected chemical liquid may be recycled to reduce fabrication costs.

The chemical liquid recovery unit 170 is positioned adjacent to the rotation unit 150. The chemical liquid recovery unit 170 recovers the chemical liquid scattered from the rotation unit 150. In more detail, the chemical liquid recovery unit 170 may be installed to surround the entire circumference of the rotation unit 150 and may recover the chemical liquid scattered from the rotation unit 150.

The chemical liquid recovery unit 170 may have, for example, a block shape with a partially open upper portion. The open upper portion of the chemical liquid recovery unit 170 may serve as an entrance for loading and unloading the substrate.

The chemical liquid recovery unit 170 separates and recovers different chemical liquids from among the chemical liquids used in the process. The chemical liquid recovery unit 170 for this purpose may include a plurality of inlets through which various types of chemical liquids are respectively introduced. Each of the inlets may be positioned side by side in a vertical direction. In other words, each of the inlets may be positioned at different heights.

In the process of processing the substrate, each of various types of chemical liquids may be introduced into and stored in a specific space of the chemical liquid recovery unit 170. For example, each of the chemical liquids introduced into the inlets may be supplied to an external chemical liquid regeneration unit (not illustrated) through a recovery line (not illustrated) and reused. The chemical liquid regeneration unit may be a device for regenerating the chemical liquid for reuse by performing concentration control, temperature control, and filtering of contaminants of the used chemical liquid.

Contaminants may be generated in the chemical liquid recovery unit 170 due to particles resulting from the process of processing the substrate, or pollutants such as fume may be generated from the remaining chemical liquid. Such contaminants may be regenerated by the chemical liquid regeneration unit, so that the substrate may be prevented from being contaminated in a subsequent process.

The above-described spraying unit 120 sprays the cleaning liquid to the rotation unit 150, the chemical liquid discharging unit 160, and the chemical liquid recovery unit 170, and sprays the drying gas for drying the remaining cleaning liquid. This ensures that even if the rotation unit 150, the chemical liquid discharging unit 160, and the chemical liquid recovery unit 170 become contaminated in the process of processing a plurality of substrates, the spraying unit 120 can remove contaminants to keep the inside of the chamber member 110 clean.

The spraying unit 120 for this purpose may include, for example, at least one guide members 121, a driving member 122, a nozzle member 123, a cleaning liquid storage member 124, and a drying gas storage member 125.

The guide member 121 may be installed to extend across the inner space of the chamber member 110. The guide member 121 may be, for example, a circular beam.

The driving member 122 may be moved along the guide member 121. The driving member 122 may be, for example, a block-shaped linear motor. The driving member 122 may be installed to surround the guide member 121, and may be moved along a longitudinal direction of the guide member 121.

The nozzle member 123 may be coupled to the driving member 122, and may spray the cleaning liquid. The nozzle member 123 may be, for example, a rod-shaped shower nozzle. Two guide members 121 may be provided to be coupled with the nozzle member 123. For example, the two guide members 121 may be arranged parallel to each other so that opposite ends of the nozzle member 123 are respectively coupled to the two guide members 121.

In an embodiment, although not illustrated in the drawings, the nozzle member 123 may be a single-fluid nozzle or a two-fluid nozzle. The nozzle member 123 configured as such may spray the cleaning liquid in the foam of mist. In an embodiment, the nozzle member 123 may spray only the cleaning liquid at a high pressure.

The above-described controller 140 may control the spraying unit 120 to spray the cleaning liquid for a reference period of time (i.e., a period of time) in a state in which the nozzle member 123 is stopped at a preset position. In an embodiment, the controller 140 may control the spraying unit 120 to spray the cleaning liquid for a period of time for which the nozzle member 123 is stopped at a preset position. Therefore, a heavily contaminated portion in the inner space of the chamber member 110 can be cleaned intensively.

The cleaning liquid storage member 124 may supply the cleaning liquid to the nozzle member 123. The cleaning liquid storage member 124 may include an upper housing 124*a* and a lower housing 124*b* configured to be coupled to each other. Coupling portions between the upper housing 124*a* and the lower housing 124*b* may be engaged with each other in a force fitting manner.

Here, components that do not require a relatively strong fastening force among components installed in the inner space of the chamber member 110 as well as the cleaning liquid storage member 124 may be assembled in a force fitting manner instead of using a bolt. This can minimize the occurrence of rust due to the cleaning liquid flowing into the joint between the bolt and the components.

The drying gas storage member 125 may supply the drying gas to the nozzle member 123. The gas stored in the drying gas storage member 125 may be a gas used to dry a liquid, but is not limited to a specific gas.

The above-described management unit 130 may include, for example, a receiving member 131, a cleaning liquid supply member 132, a cleaning liquid discharging member 133, and a cleaning liquid removing member 134.

The receiving member 131 may have an open side. The receiving member 131 may have a size sufficient to receive the nozzle member 123. The cleaning liquid used to clean the nozzle member 123 may be filled in the receiving member 131.

An insertion portion 131*a* may be formed at the open side of the receiving member 131. For example, the receiving member 131 may include the insertion portion 131*a* at the open side. The insertion portion 131*a* may be formed in a recessed shape to allow a part of the spraying unit 120 from which the cleaning liquid is sprayed to be inserted therein. For example, the insertion portion 131*a* may have a shape corresponding to a shape of the nozzle member 123. For example, the insertion portion 131*a* may have a shape corresponding to a shape of the part of the nozzle member 123 to receive the nozzle member 123. Although not illustrated in the drawings, a seal ring may be installed in the insertion portion 131*a*. The seal ring may prevent the cleaning liquid from being discharged in a state in which the nozzle member 123 is inserted into the insertion portion 131*a*.

The cleaning liquid supply member 132 may supply the cleaning liquid for cleaning the spraying unit 120 to the receiving member 131. Although not illustrated in the drawings, the cleaning liquid supply member 132 may include a storage tank, a pump, and a control valve. The cleaning liquid supply member 132 may be installed to communicate with an upper side surface of the receiving member 131.

The cleaning liquid discharging member 133 may discharge the cleaning liquid filled in the receiving member 131. Although not illustrated in the drawings, the cleaning liquid discharging member 133 may include a discharge valve 111 and a recovery tank. The cleaning liquid discharging member 133 may be installed to communicate with a bottom surface of the receiving member 131.

The cleaning liquid removing member 134 may suck the cleaning liquid remaining inside the receiving member 131. The cleaning liquid removing member 134 may be, for example, a vacuum pump. In an embodiment, the cleaning liquid removing member 134 may supply hot air into the receiving member 131 to remove the remaining cleaning liquid.

An operation process of the management unit 130 configured as such will be described with reference to the drawings.

Figure 5:
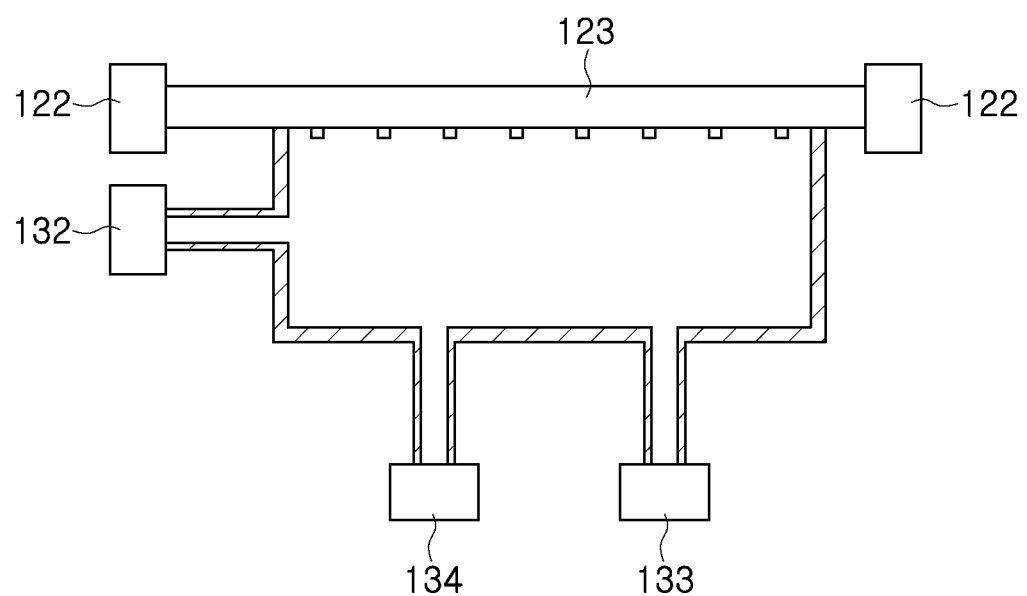
FIG. 5 is a view illustrating a state in which a nozzle member is received in a receiving member.

Referring to FIG. 5, the nozzle member 123 of the spraying unit 120 may be positioned in the receiving member 131 of the management unit 130. At this time, the above-described controller 140 may operate the cleaning liquid removing member 134 in a state in which the part of the spraying unit 120 from which the cleaning liquid is sprayed is docked to the management unit 130.

Figure 6:
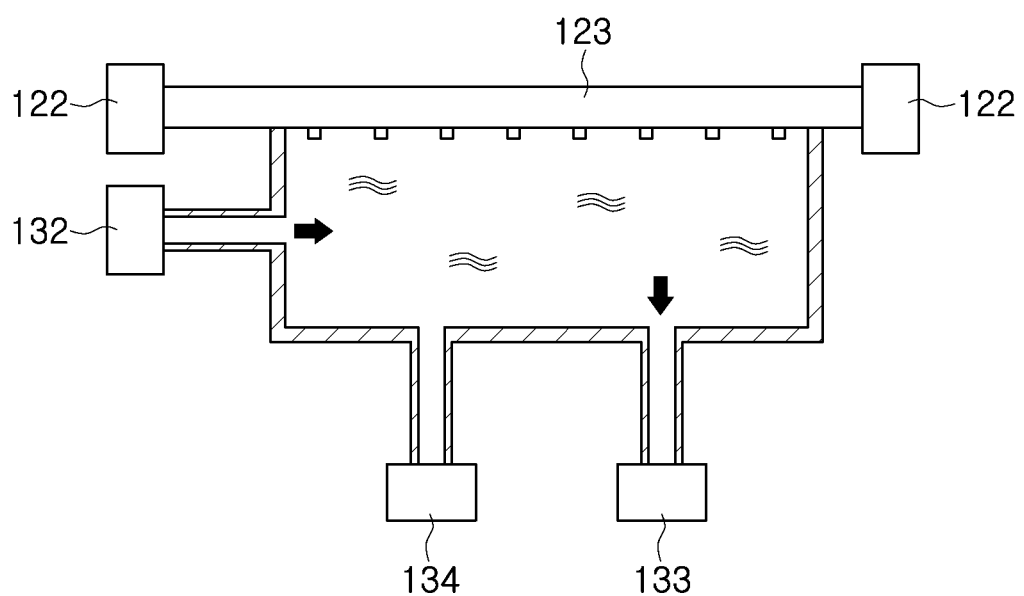
FIG. 6 is a view illustrating a state in which the cleaning liquid is filled in the receiving member.

As illustrated in FIG. 6, when the cleaning liquid supply member 132 is operated and the cleaning liquid is filled in the receiving member 131 until the nozzle member 123 is immersed in the cleaning liquid, the cleaning liquid discharging member 133 may be operated. At this time, the cleaning liquid supply member 132 may continue to operate to supply a clean cleaning liquid into the receiving member 131.

For this purpose, the above-described controller 140 may operate the cleaning liquid supply member 132 until the cleaning liquid is filled to a target level of the receiving member 131, and may stop the operation of the cleaning liquid discharging member 133. Therefore, the cleaning liquid may be continuously filled in the receiving member 131 without being discharged.

After the cleaning of the spraying unit 120 is completed, the cleaning liquid discharging member 133 is operated to discharge the entire cleaning liquid inside the receiving member 131. In other words, when the cleaning liquid is filled to the target level of the receiving member 131, the controller 140 may operate the cleaning liquid discharging member 133 to discharge the cleaning liquid.

Figure 7:
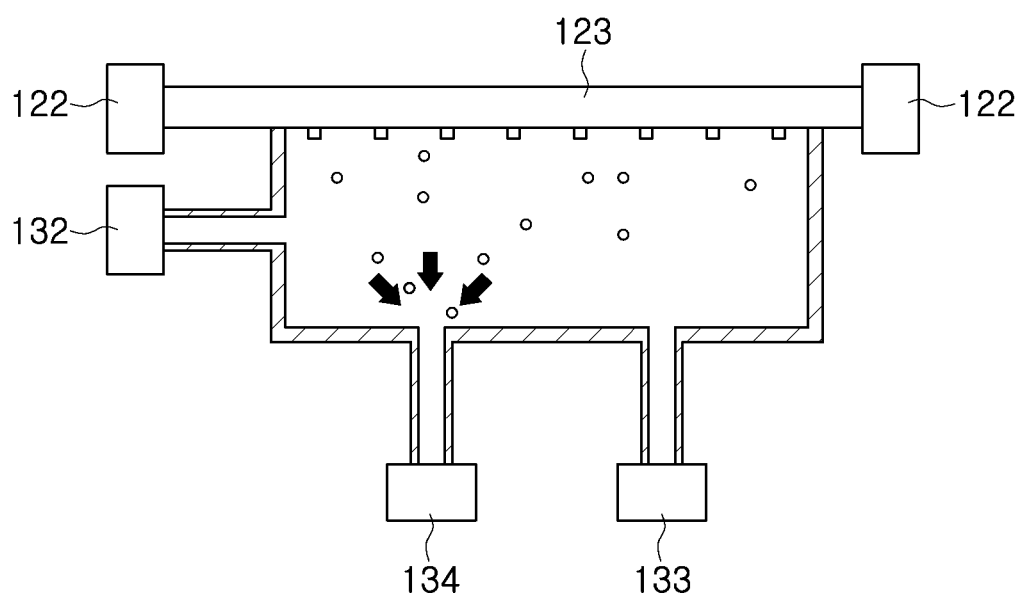
FIG. 7 is a view illustrating a state in which the cleaning liquid remaining on the nozzle member is being removed.

Finally, as illustrated in FIG. 7, the cleaning liquid removing member 134 may be operated to remove the cleaning liquid remaining on the nozzle member 123.

Hereinafter, a substrate processing method S100 of cleaning an inner space of a chamber member using the above-described substrate processing apparatus will be described in detail with reference to the drawings.

Figure 8:
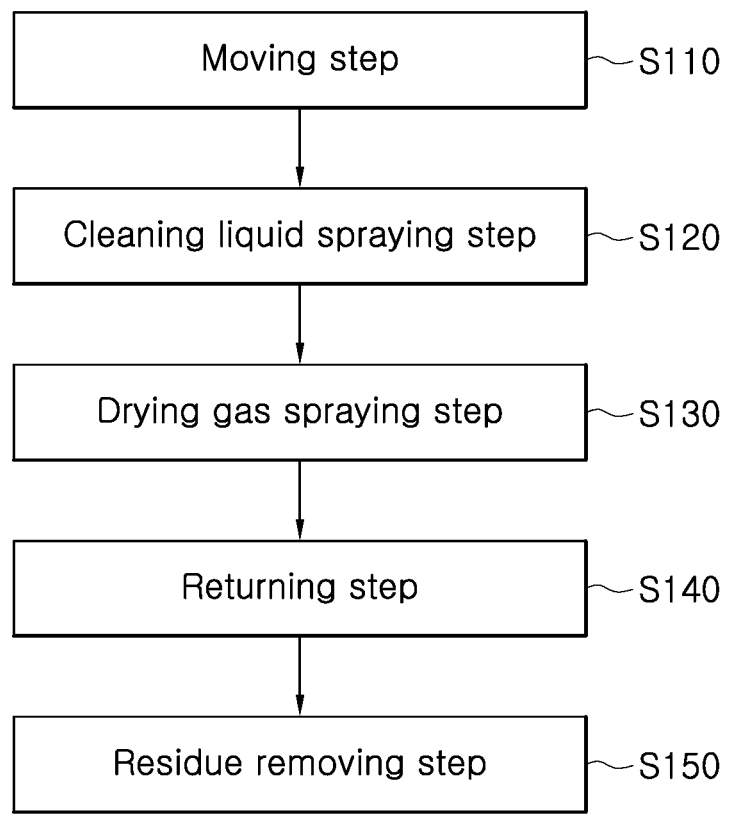
FIG. 8 is a flowchart sequentially illustrating a substrate processing method according to an embodiment of the present disclosure.

Referring to FIG. 8, the substrate processing method S100 according to an embodiment of the present disclosure may include a moving step S110, a cleaning liquid spraying step S120, a drying gas spraying step S130, a returning step S140, and a residue removing step S150.

In the moving step S110, a nozzle member is moved from a management unit. As a driving member is moved along a guide member, the nozzle member is moved in the inner space of the chamber member.

In the cleaning liquid spraying step S120, a cleaning liquid is sprayed into the inner space of the chamber member. In the cleaning liquid spraying step S120, the cleaning liquid may be sprayed for a reference period of time in a state in which the nozzle member is stopped at a preset position.

In the drying gas spraying step S130, a drying gas is sprayed into the inner space of the chamber member. The drying gas spraying step S130 may be performed after the cleaning liquid spraying step S120.

In the returning step S140, the nozzle member is returned to the management unit.

In the residue removing step S150, the management unit removes a residue remaining on the nozzle member. In the residue removing step S150, the nozzle member is cleaned with the cleaning liquid, after which the residue remaining on the nozzle member may be removed by means of vacuum suction.

The substrate processing method S100 according to the embodiment of the present disclosure as described above may repeatedly perform the moving step S110, the cleaning liquid spraying step S120, the drying gas spraying step S130, the returning step S140, and the residue removing step S150 every reference number of times the substrate is processed. This ensures that the cleaning is performed before the inner space of the chamber member is heavily contaminated by a chemical liquid, thereby significantly reducing the number of times the chamber member is cleaned separately.

Since each step of the substrate processing method S100 according to the embodiment of the present disclosure has been described in detail while describing the substrate processing apparatus, a description thereof will be omitted.

The description of the present disclosure has been presented with reference to the accompanying drawings for purposes of illustration and description, but is not intended to be exhaustive or limited to the disclosure in the form disclosed. Many modifications and variations will be apparent to those of ordinary skill in the art without departing from the scope and spirit of the disclosure. Accordingly, all such modifications and variations are intended to be included within the scope of this disclosure as defined in the appended claims.

What is claimed is:

1. A substrate processing apparatus comprising:
   a spraying unit installed in an inner space of a chamber member in which a substrate is processed, configured to spray a cleaning liquid into the inner space of the chamber member so as to clean devices for discharging a chemical liquid to the substrate and then collecting the chemical liquid, and configured to spray a drying gas for drying the remaining cleaning liquid into the inner space of the chamber member;
   a management unit configured to remove a residue remaining on the spraying unit; and
   a controller configured to control the spraying unit and the management unit.

2. A substrate processing apparatus comprising:
   a chamber member comprising an inner space;
   a rotation unit installed in the inner space of the chamber member, configured to support a substrate, and configured to rotate the substrate;
   a chemical liquid discharging unit positioned above the rotation unit and configured to discharge a chemical liquid to the rotation unit;
   a chemical liquid recovery unit positioned adjacent to the rotation unit and configured to collect the chemical liquid scattered from the rotation unit;
   a spraying unit installed to be movable in an upper portion of the inner space of the chamber member configured to spray a cleaning liquid to the rotation unit, the chemical liquid discharging unit, and the chemical liquid recovery unit, and configured to spray a drying gas for drying the remaining cleaning liquid into the inner space of the chamber member;
   a management unit configured to remove a residue remaining on the spraying unit after the spraying unit sprays the cleaning liquid; and
   a controller configured to control the spraying unit and the management unit.

3. The substrate processing apparatus of claim 2,
   wherein the spraying unit comprises:
   at least one guide member extending across the inner space of the chamber member;
   a driving member configured to be moved along the guide member;
   a nozzle member coupled to the driving member and configured to spray the cleaning liquid;
   a cleaning liquid storage member configured to supply the cleaning liquid to the nozzle member; and
   a drying gas storage member configured to supply the drying gas to the nozzle member.

4. The substrate processing apparatus of claim 3,
   wherein the controller controls the spraying unit to spray the cleaning liquid for a period of time, and
   wherein for the period of time, the nozzle member is stopped at a preset position.

5. The substrate processing apparatus of claim 3,
   wherein the nozzle member is a single-fluid nozzle or a two-fluid nozzle.

6. The substrate processing apparatus of claim 3, further comprising:
   two guide members coupled to the nozzle member,
   wherein the nozzle member is a rod-shaped shower nozzle, and
   wherein the two guide members are arranged parallel to each other so that opposite ends of the nozzle member are respectively coupled to the two guide members.

7. The substrate processing apparatus of claim 3,
   wherein the cleaning liquid storage member comprises an upper housing and a lower housing coupled with each other using a force fitting manner.

8. The substrate processing apparatus of claim 2,
   wherein the management unit comprises:
   a receiving member having an open side;
   a cleaning liquid supply member configured to supply the cleaning liquid for cleaning the spraying unit to the receiving member;
   a cleaning liquid discharging member configured to discharge the cleaning liquid filled in the receiving member; and
   a cleaning liquid removing member configured to suck the cleaning liquid remaining inside the receiving member.

9. The substrate processing apparatus of claim 8,
   wherein the receiving member includes an insertion portion formed in a recessed shape at the open side of the receiving member to receive a part of the spraying unit.

10. The substrate processing apparatus of claim 8,
    wherein the cleaning liquid removing member is a vacuum pump.

11. The substrate processing apparatus of claim 8,
    wherein the controller operates the cleaning liquid removing member on a part of the spraying unit, the spraying unit being docked to the management unit.

12. The substrate processing apparatus of claim 8,
    wherein the controller operates the cleaning liquid supply member, wherein in response to when the cleaning liquid is filled to a target level of the receiving member, the controller stops an operation of the cleaning liquid discharging member, and wherein in response to when the cleaning liquid is filled to the target level of the receiving member, the controller operates the cleaning liquid discharging member to discharge the cleaning liquid.

13. The substrate processing apparatus of claim 2, wherein a discharge valve is installed on a bottom surface of the chamber member.

14. The substrate processing apparatus of claim 2, wherein the controller operates the spraying unit every reference number of times the substrate is processed.

\* \* \* \* \*